United States Patent
Shikauchi et al.

(10) Patent No.: US 10,529,842 B2
(45) Date of Patent: Jan. 7, 2020

(54) SEMICONDUCTOR BASE SUBSTANCE HAVING A BORON CONTAINING BUFFER LAYER, SEMICONDUCTOR DEVICE INCLUDING THE SAME, AND METHODS FOR MANUFACTURING THE SEMICONDUCTOR BASE SUBSTANCE AND THE SEMICONDUCTOR DEVICE

(71) Applicants: SANKEN ELECTRIC CO., LTD., Niiza-shi, Saitama (JP); SHIN-ETSU HANDOTAI CO., LTD., Tokyo (JP)

(72) Inventors: Hiroshi Shikauchi, Niiza (JP); Ken Sato, Miyoshi-machi (JP); Masaru Shinomiya, Annaka (JP); Keitaro Tsuchiya, Takasaki (JP); Kazunori Hagimoto, Takasaki (JP)

(73) Assignees: SANKEN ELECTRIC CO., LTD., Niiza-shi (JP); SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 15/760,579

(22) PCT Filed: Aug. 29, 2016

(86) PCT No.: PCT/JP2016/003915
§ 371 (c)(1),
(2) Date: Mar. 15, 2018

(87) PCT Pub. No.: WO2017/056389
PCT Pub. Date: Apr. 6, 2017

(65) Prior Publication Data
US 2018/0269316 A1    Sep. 20, 2018

(30) Foreign Application Priority Data

Sep. 30, 2015   (JP) .................................. 2015-194840

(51) Int. Cl.
| | | |
|---|---|---|
| *H01L 29/778* | (2006.01) | |
| *H01L 21/02* | (2006.01) | |
| *H01L 29/36* | (2006.01) | |
| *H01L 29/66* | (2006.01) | |

(Continued)

(52) U.S. Cl.
CPC ...... *H01L 29/7787* (2013.01); *H01L 21/0254* (2013.01); *H01L 29/36* (2013.01); *H01L 29/66431* (2013.01); *H01L 29/2003* (2013.01)

(58) Field of Classification Search
CPC . H01L 21/0254; H01L 29/36; H01L 29/7786; H01L 29/7787; H01L 29/66462;

(Continued)

(56) References Cited

U.S. PATENT DOCUMENTS

| | | |
|---|---|---|
| 2010/0123169 A1 | 5/2010 | Sato |
| 2013/0075786 A1 | 3/2013 | Ishiguro |

(Continued)

FOREIGN PATENT DOCUMENTS

| | | |
|---|---|---|
| JP | 2010-123725 A | 6/2010 |
| JP | 2013-074211 A | 4/2013 |
| JP | 2014-236050 A | 12/2014 |

OTHER PUBLICATIONS

Oct. 11, 2016 International Search Report issued in International Patent Application No. PCT/JP2016/003915.

(Continued)

*Primary Examiner* — Thanh T Nguyen
(74) *Attorney, Agent, or Firm* — Oliff PLC (57) ABSTRACT

A semiconductor base substance includes: a substrate; a buffer layer which is made of a nitride semiconductor and provided on the substrate; and a channel layer which is made of a nitride semiconductor and provided on the buffer layer, wherein the buffer layer includes: a first region which is provided on the substrate side and has boron concentration higher than acceptor element concentration; and a second (Continued)

region which is provided on the first region, and has boron concentration lower than that in the first region and acceptor element concentration higher than that in the first region. As a result, the semiconductor base substance which can obtain a high pit suppression effect while maintaining a high longitudinal breakdown voltage is provided.

8 Claims, 11 Drawing Sheets

(51) Int. Cl.
*H01L 29/20* (2006.01)

(58) Field of Classification Search
CPC ........... H01L 29/66431; H01L 29/2003; H01L 29/778; H01L 29/20; H01L 21/02; H01L 29/66
See application file for complete search history.

(56) References Cited

U.S. PATENT DOCUMENTS

2014/0091313 A1* 4/2014 Kotani ................. H01L 29/205
257/76
2016/0111273 A1* 4/2016 Shikauchi ......... H01L 21/02381
257/22

OTHER PUBLICATIONS

Apr. 3, 2018 International Preliminary Report on Patentability issued in International Patent Application No. PCT/JP2016/003915.
Jul. 23, 2019 Office Action issued in Japanese Patent Application No. 2015-194840.

* cited by examiner

SEMICONDUCTOR BASE SUBSTANCE HAVING A BORON CONTAINING BUFFER LAYER, SEMICONDUCTOR DEVICE INCLUDING THE SAME, AND METHODS FOR MANUFACTURING THE SEMICONDUCTOR BASE SUBSTANCE AND THE SEMICONDUCTOR DEVICE

TECHNICAL FIELD

The present invention relates to a semiconductor base substance, a semiconductor device, a method for manufacturing a semiconductor base substance, and a method for manufacturing a semiconductor device.

BACKGROUND ART

It is general that a nitride semiconductor layer is formed on an inexpensive silicon substrate or sapphire substrate. However, lattice constants of these substrates are greatly different from a lattice constant of the nitride semiconductor layer, and they also have different thermal expansion coefficients. Thus, considerable strain energy is produced in the nitride semiconductor layer formed on a substrate by epitaxial growth. As a result, cracks are likely to be produced or crystal quality is likely to be lowered in the nitride semiconductor layer.

To solve the problem, a buffer layer having a nitride semiconductor layer with a different composition stacked thereon is arranged between the substrate and a functional layer formed of a nitride semiconductor in conventional examples.

Further, in order to improve characteristics of the nitride semiconductor layer, various suggestions about a buffer layer have been made. For example, Patent Document 1 discloses that boron is contained in the buffer layer in order to reduce pit density (i.e., defect density).

On the other hand, there has been known that a longitudinal breakdown voltage is improved by doping the buffer layer with iron. For example, in a semiconductor base substance disclosed in Patent Document 2, a longitudinal breakdown voltage of a buffer layer is increased by doping iron.

CITATION LIST

Patent Literatures

Patent Document 1: Japanese Unexamined Patent Publication (Kokai) No. 2014-236050
Patent Document 2: Japanese Unexamined Patent Publication (Kokai) No. 2010-123725

DISCLOSURE OF INVENTION

Problem to be Solved by the Invention

However, the present inventors have found out that the conventional technology has the following problem.

That is, even in a case where boron is contained in the buffer layer in order to reduce the pit density, when the buffer layer is doped with an acceptor element such as a transition metal in order to improve a longitudinal breakdown voltage of a device, a pit suppression effect provided by boron is decreased, and characteristics of the device are degraded.

In view of the above-described problem, it is an object of the present invention to provide a semiconductor base substance which can provide a high pit suppression effect while maintaining a high longitudinal breakdown voltage and a semiconductor device using this.

Means for Solving Problem

To achieve the object, the present invention provides a semiconductor base substance including: a substrate; a buffer layer which is made of a nitride semiconductor and provided on the substrate; and a channel layer which is made of a nitride semiconductor and provided on the buffer layer, wherein the buffer layer includes: a first region which is provided on the substrate side and has boron concentration higher than acceptor element concentration; and a second region which is provided on the first region, and has boron concentration lower than that in the first region and acceptor element concentration higher than that in the first region.

As described above, since the buffer layer has the first region which is provided on the substrate side and has the boron concentration higher than the acceptor element concentration and the second region which is provided on the first region and has the boron concentration lower than that in the first region and the acceptor element concentration higher than that in the first region, a high longitudinal breakdown voltage can be maintained while providing a high bit suppression effect.

At this time, it is preferable that the buffer layer includes a decreasing region where the boron concentration decreases from the substrate side toward the channel layer side, and that the buffer layer includes an increasing region where an acceptor element increases from the substrate side toward the channel layer side on the channel layer side of a boron concentration decrease start position of the decreasing region.

When such a structure is adopted, the high pit suppression effect can be further effectively provided.

At this time, the buffer layer can include an initial layer made of AlN on the substrate side, and the initial layer can be provide not so as to contain the acceptor element.

When such an initial layer is provided in the buffer layer, the high pit suppression effect can be further effectively provided, and the element in the buffer layer can be prevented from reacting with the substrate.

At this time, the buffer layer can include an initial layer made of AlN on the substrate side, and the acceptor element concentration of the initial layer can be set lower than the boron concentration of the initial layer.

When such an initial layer is provided in the buffer layer, the high pit suppression effect can be provided, and the element in the buffer layer can be prevented from reacting with the substrate.

At this time, it is preferable that the acceptor element is any one of a transition metal, carbon, and magnesium.

As the acceptor element which is introduced into the buffer layer, such elements can be preferably used.

Furthermore, the present invention provides a semiconductor device including: the semiconductor base substance; and electrodes provided over the channel layer.

Such a semiconductor device can be a semiconductor device which can provide the high pit suppression effect while maintaining the high longitudinal breakdown voltage.

Moreover, the present invention provides a method for manufacturing a semiconductor base substance including: forming a buffer layer made of a nitride semiconductor on a substrate; and forming a channel layer made of a nitride semiconductor on the buffer layer, wherein the buffer layer includes an initial layer made of AlN on the substrate side, the forming the buffer layer includes introducing boron into the buffer layer in such a manner that boron concentration in the buffer layer gradually decreases from the substrate side toward the channel layer side, and doping of an acceptor element is started after formation of the initial layer in the forming the buffer layer.

As described above, when doping of the acceptor element is started after formation of the initial layer in the forming the buffer layer, the high pit suppression effect can be provided while maintaining the high longitudinal breakdown voltage.

Here, a substrate doped with boron can be used as the substrate, and the introducing boron into the buffer layer can include diffusing boron into the buffer layer from the substrate doped with boron by thermal diffusion.

As described above, when boron is diffused in the buffer layer from the substrate doped with boron by the thermal diffusion to introduce boron into the buffer layer, boron concentration in the buffer layer can be further efficiently gradually reduced from the substrate side toward the channel layer side.

Additionally, the introducing boron into the buffer layer can include doping boron from a vapor phase by introducing a dopant gas containing boron at the time of forming the buffer layer by vapor phase growth.

In this manner, when doping of boron can be performed from the vapor phase to introduce boron into the buffer layer by introducing the dopant gas containing boron during the vapor phase growth, the buffer layer can contain boron which is sufficient to obtain the pit suppression effect.

At this time, it is preferable to use any one of a transition metal, carbon, and magnesium as the acceptor element.

As the acceptor element which is introduced into the buffer layer, such elements can be preferably used.

Further, the present invention provides a method for manufacturing a semiconductor device including: preparing a semiconductor base substance manufactured by the method for manufacturing a semiconductor base substance; and forming electrodes over the channel layer.

According to such a method for manufacturing a semiconductor device, a semiconductor device which can obtain the high pit suppression effect while maintaining the high longitudinal breakdown voltage can be manufactured.

Effect of the Invention

As described above, according to the semiconductor base substance of the present invention, the semiconductor base substance which can obtain the high pit suppression effect while maintaining the high longitudinal breakdown voltage can be provided. Furthermore, according to the semiconductor device of the present invention, the semiconductor device in which generation of pits is suppressed while maintaining the high longitudinal breakdown voltage can be provided. Moreover, according to the method for manufacturing a semiconductor base substance of the present invention, a semiconductor base substance which can obtain the high pit suppression effect while maintaining the high longitudinal breakdown voltage can be manufactured. Additionally, according to the method for manufacturing a semiconductor device of the present invention, a semiconductor device in which generation of pits is suppressed while maintaining the high longitudinal breakdown voltage can be manufactured.

BEST MODE(S) FOR CARRYING OUT THE INVENTION

As described above, in order to reduce pit density, boron doping must be performed in a buffer layer, but when the buffer layer is doped with an acceptor element such as a transition metal in order to improve a longitudinal breakdown voltage of a device even though the boron doping is performed in the buffer layer, there occurs a problem that a pit suppression effect provided by boron is lowered and characteristics of the device are degraded.

Thus, the present inventors have repeatedly conducted the earnest studies about a semiconductor base substance which can obtain the high pit suppression effect while maintaining the high longitudinal breakdown voltage.

As a result, the present inventors have found out that, when a first region which is provided on a substrate side and has boron concentration higher than acceptor element concentration and a second region which is provided on the first region and has boron concentration lower than that in the first region and acceptor element concentration higher than that in the first region are provided in the buffer layer, the high pit suppression effect can be provided by the first region, and the high longitudinal breakdown voltage can be maintained by the second region, thereby bringing the present invention to completion.

Although one embodiment of the present invention will now be described hereinafter in detail with reference to the drawings, the present invention is not restricted thereto.

A semiconductor base substance in this embodiment will be first described with reference to FIGS. 1 and 2.

Figure 1:
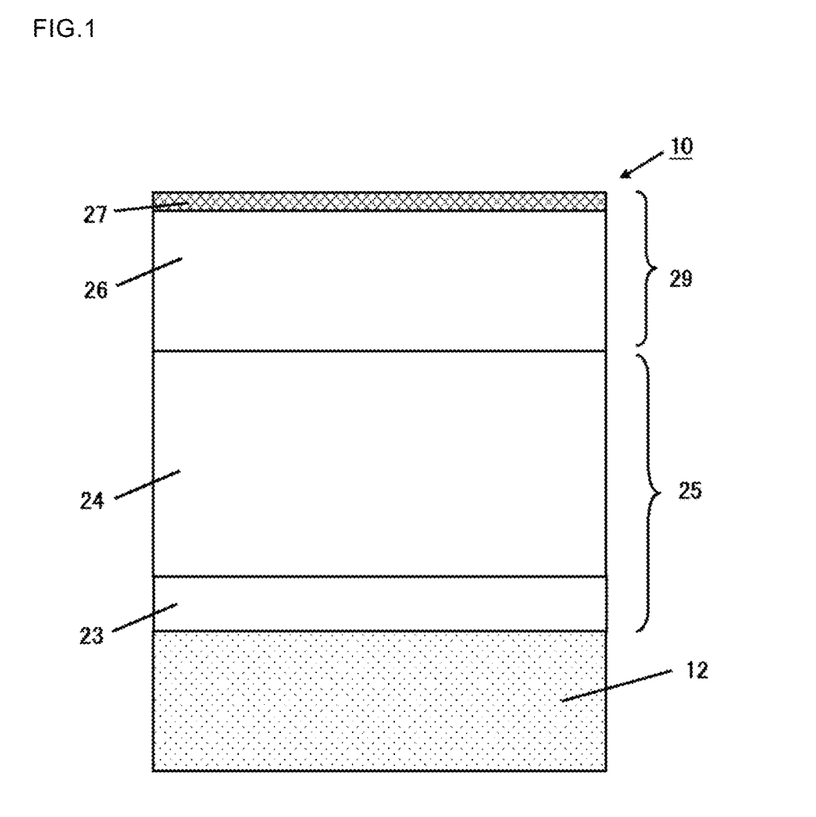
FIG. 1 is a schematic cross-sectional view of an embodiment of a semiconductor base substance.

As shown in FIG. 1 which is a schematic cross-sectional view of a semiconductor base substance 10 in this embodiment, the semiconductor base substance 10 includes a substrate 12, a buffer layer 25 which is provided on the substrate 12 and made of a nitride semiconductor, and a channel layer 26 which is provided on the buffer layer 25 and made of a nitride semiconductor. The substrate 12 may be, e.g., a silicon-based substrate such as a silicon substrate or an SiC substrate, and the channel layer 26 may be, e.g., a GaN layer.

The buffer layer 25 includes a first region 23 which is provided on the substrate 12 and has boron concentration higher than acceptor element concentration and a second region 24 which is provided on the first region 23 on the opposite side of the substrate 12 and has boron concentration lower than that in the first region 23 and acceptor element concentration higher than that in the first region 23. Here, it is preferable that the boron concentration in the first region 23 is $1\times10^{17}$ to $1\times10^{21}$ atoms/cm$^3$ and that the acceptor element concentration in the first region 23 is $1\times10^{15}$ to $5\times10^{17}$ atoms/cm$^3$. Additionally, it is preferable that the boron concentration in the second region 24 is $1\times10^{13}$ to $1\times10^{15}$ atoms/cm$^3$ and that the acceptor concentration in the second region 24 is $5\times10^{17}$ to $1\times10^{20}$ atoms/cm$^3$.

It is to be noted that the semiconductor base substance 10 can include a barrier layer 27 on the channel layer 26, and the channel layer 26 and the barrier layer 27 can form an operation layer 29. As this barrier layer 27, for example, an AlGaN layer can be adopted.

When the buffer layer 25 has the first region 23 which is provided on the substrate 12 side and has the boron concentration higher than the acceptor element concentration, a high pit suppression effect can be obtained, and pits in the nitride semiconductor layer on the first region 23 can be excellently suppressed. Further, when the buffer layer 25 has the second region 24 which is provided on the first region 23 and has the boron concentration lower than that in the first region 23 and the acceptor element concentration higher than that in the first region 23, a high longitudinal breakdown voltage can be maintained.

In the semiconductor base substance 10, it is preferable that the buffer layer 25 includes a reducing region where the boron concentration reduces from the substrate 12 side toward the channel layer 26 side, and that the buffer layer 25 includes an increasing region where the acceptor element increases from the substrate 12 side toward the channel layer 26 side on the channel layer 26 side of a boron concentration decrease start position of the reducing region. With such a structure, since the acceptor element concentration in the buffer layer 25 on the substrate 12 side can be further assuredly lowered, the high pit suppression effect can be obtained further effectively regarding the reducing region and the nitride semiconductor layer formed thereon. Here, it is preferable that an increase ratio of the acceptor element concentration in the increasing region in the buffer layer is larger (i.e., to have a steep tilt) than a decrease ratio in the decreasing region configured to reduce the acceptor element concentration in an upper portion of the channel layer above the increasing region.

Figure 2:
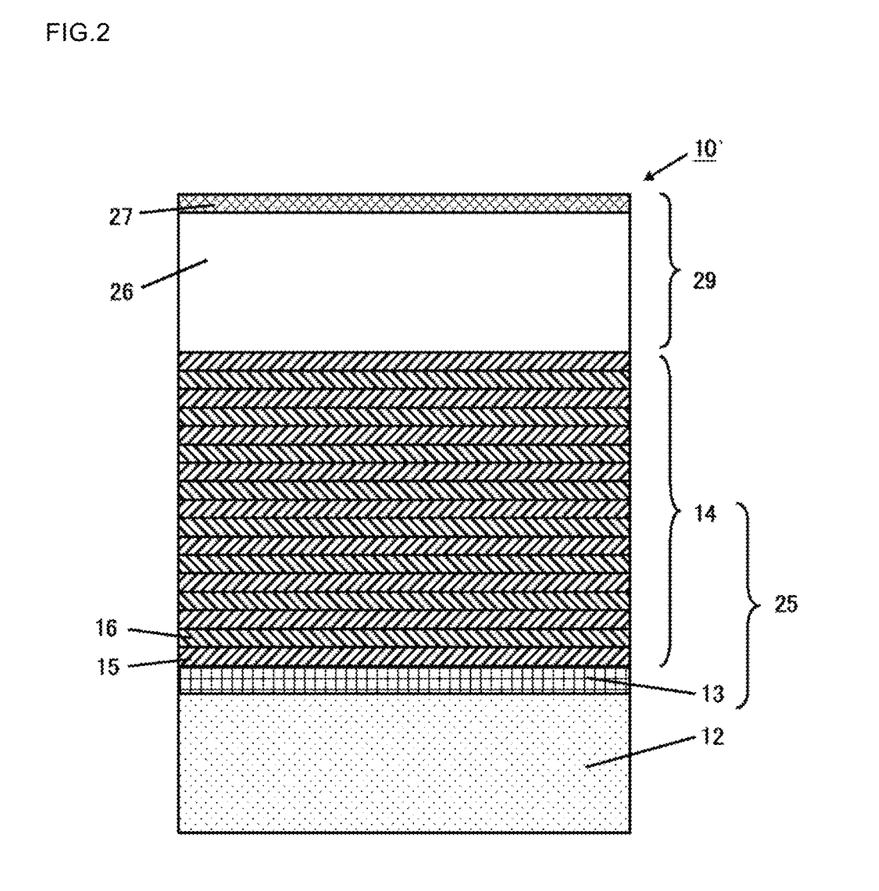
FIG. 2 is a schematic cross-sectional view showing one embodiment of the semiconductor base substance.

Furthermore, as shown in FIG. 2 which is a schematic cross-sectional view showing one embodiment of the semiconductor base substance of the present invention, the buffer layer 25 can be configured to include an initial layer 13 which is provided on the substrate 12 side and made of AlN and a stacked body 14 provided on the initial layer 13. The stacked body 14 can be configured as a stacked body in which first layers 15 made of a nitride semiconductor and second layers 16 having a composition different from that of the first layers 15 are repeatedly stacked. The first layers 15 are made of, e.g., AlyGa1-yN, and the second layers 16 are made of, e.g., AlxGa1-xN ($0\leq x\leq y\leq 1$).

Specifically, the first layers 15 can be AlN layers, and the second layers 16 can be GaN layers.

In a semiconductor base substance 10' in FIG. 2, the initial layer 13 can be configured not so as to contain an acceptor element. When such an initial layer is provided in the buffer layer 25, the high pit suppression effect can be obtained further effectively regarding the nitride semiconductor layer on the initial layer, and the element in the buffer layer 25 can be prevented from reacting with the substrate 12.

In the semiconductor base substance 10' in FIG. 2, the acceptor element concentration in the initial layer 13 can be set lower than the boron concentration in the initial layer 13. When such an initial layer is provided in the buffer layer 25, the high pit suppression effect can be obtained, and the element in the buffer layer 25 can be prevented from reacting with the substrate 12.

It is preferable that the acceptor element introduced into the buffer layer 25 is any one of a transition metal, carbon, and magnesium. Although such elements can be preferably used as the acceptor element, using iron is particularly preferable.

An example of a semiconductor device according to an embodiment of the present invention will now be described hereinafter with reference to FIG. 3.

Figure 3:
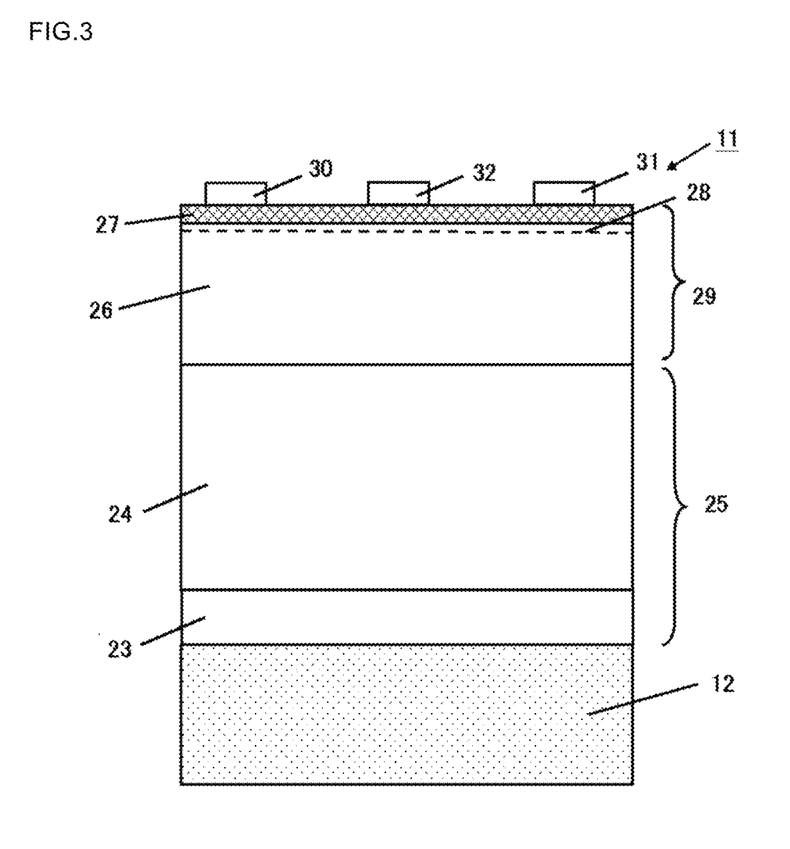
FIG. 3 is a schematic cross-sectional view showing one embodiment of a semiconductor device.

FIG. 3 is a schematic cross-sectional view showing one embodiment of a semiconductor device according to the present invention.

In the semiconductor device 11 shown in FIG. 3, electrodes (e.g., a first electrode 30, a second electrode 31, and a control electrode 32) are provided over a channel layer 26 of the semiconductor base substance 10 in FIG. 1 through, e.g., a barrier layer 27. It is to be noted that, when a level to trap a carrier is formed in an upper portion of the channel layer, it can cause a reduction in mobility due to impurity scattering or a current collapse phenomenon, and hence it is desirable to set acceptor element concentration in the upper portion of the channel layer 26 to be lower than acceptor element concentration in a buffer layer 25 on the channel layer 26 side.

In the semiconductor device 11, for example, the first electrode 30 and the second electrode 31 can be arranged in such a manner that a current flows to the second electrode 31 from the first electrode via a two-dimensional electron gas 28 formed in the channel layer 26.

The current flowing between the first electrode 30 and the second electrode 31 can be controlled by using a potential which is applied to the control electrode 32.

According to such a semiconductor device, the high-quality semiconductor device in which generation of pits is suppressed while maintaining a high longitudinal breakdown voltage is maintained can be provided.

A method for manufacturing the semiconductor base substance according to one embodiment of the present invention will now be described with reference to FIG. 4.

Figure 4:
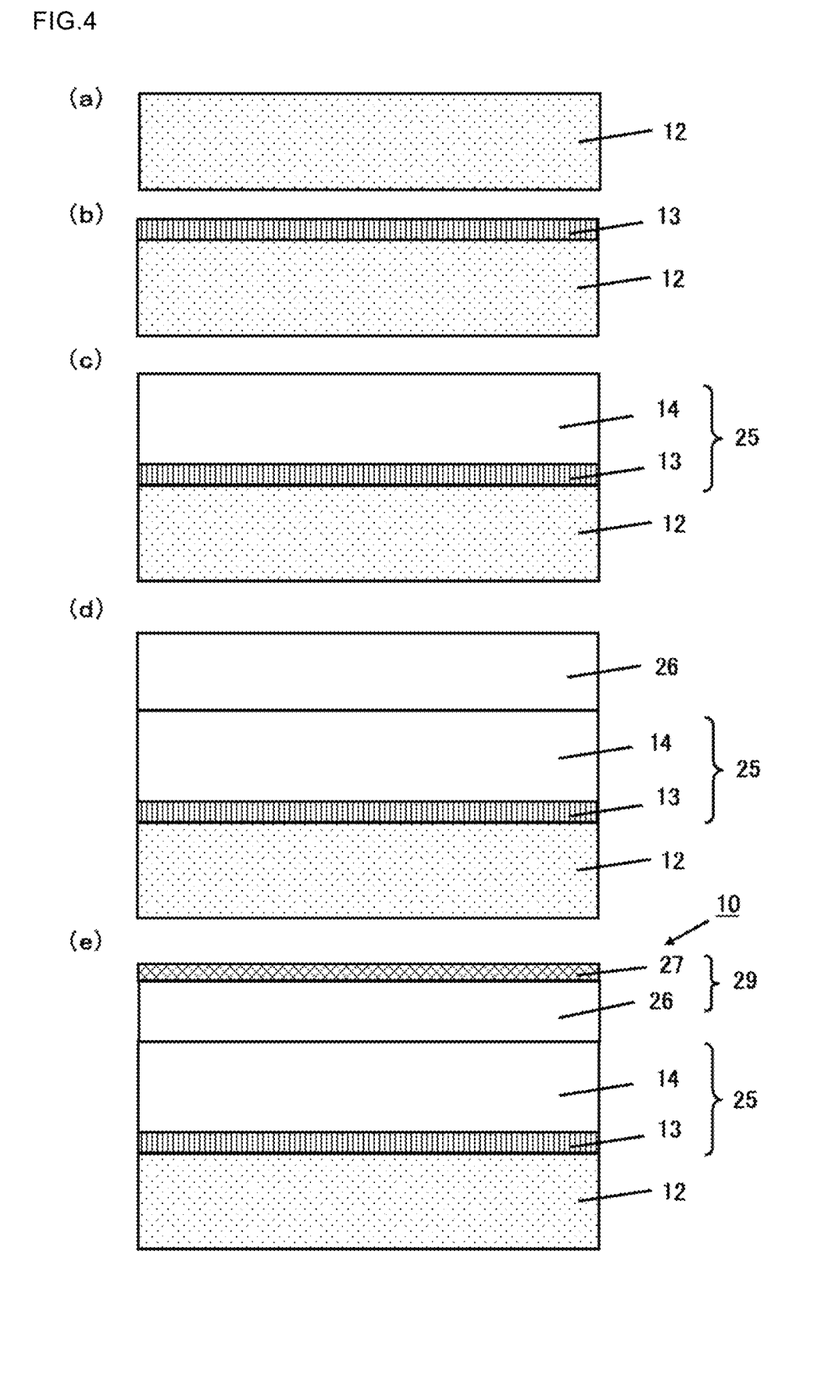
FIG. 4 are process cross-sectional views showing one embodiment of a method for manufacturing a semiconductor base substance.

First, a substrate 12 is prepared (see FIG. 4(a)). As the substrate 12, for example, a silicon substrate or an SiC substrate can be used.

Then, an initial layer 13 which is provided on the substrate 12 side of a buffer layer 25 and made of AlN is formed on the substrate 12 (see FIG. 4(b)). Specifically, for example, the initial layer 13 can be grown to 10 to 300 nm at a temperature of, e.g., 800° C. to 1200° C. by an MOVPE (metal organic vapor phase epitaxy) method.

Subsequently, a stacked body 14 which is provided on a channel layer 26 side of the buffer layer 25 and made of a nitride semiconductor is formed on the initial layer 13 (see FIG. 4(c)). Specifically, for example, first layers 15 (see FIG. 2) made of AlN and second layers 16 (see FIG. 2) made of GaN can be alternately grown at a temperature of, e.g., 800° C. to 1200° C. by the MOVPE method. A film thickness of the first layer 15 is, e.g., 3 to 30 nm, and a film thickness of the second layer 16 is, e.g., 2 to 7 nm.

In the method for manufacturing a semiconductor base substance, the forming the buffer layer 25 includes introducing boron into the buffer layer in such a manner that the boron concentration in the buffer layer 25 gradually decreases toward the channel layer 26 side from the substrate 12 side.

As the introducing boron into the buffer layer 25, it is possible to adopt, e.g., diffusing boron into the buffer layer 25 from the substrate 12 doped with boron by thermal diffusion while using a substrate doped with boron at concentration of $1\times10^{18}$ atoms/cm$^3$ to $1\times10^{21}$ atoms/cm$^3$ or preferably $5\times10^{18}$ atoms/cm$^3$ to $5\times10^{19}$ atoms/cm$^3$ as the substrate 12.

When boron is diffused into the buffer layer 25 from the substrate doped with boron by the thermal diffusion to introduce boron into the buffer layer 25 in this manner, the boron concentration in the buffer layer 25 can be more efficiently gradually reduced from the substrate 12 side toward the channel layer 26 side.

Furthermore, as the introducing boron into the buffer layer 25, it is possible to adopt doping boron from a vapor phase by introducing a dopant gas containing boron at the time of forming the buffer layer 25 by vapor phase growth.

In this manner, when boron is doped from the vapor phase by introducing the dopant gas containing boron during the vapor phase growth and boron is thereby introduced into the buffer layer 25, the buffer layer 25 contain boron which is sufficient to provide the pit suppression effect.

In the method for manufacturing a semiconductor base substance, doping of the acceptor element is started such that the acceptor element has a maximum value of $5\times10^{17}$ atoms/cm$^3$ to $5\times10^{20}$ atoms/cm$^3$ after forming the initial layer 13 in formation of the buffer layer 25. Specifically, at the time of starting forming of the stacked body 14 by an MOCVD method, addition of an acceptor element doping gas such as Cp$_2$Fe (biscyclopentadienyl iron) can be started.

When doping of the acceptor element is started after forming the initial layer in the formation of the buffer layer 25 in this manner, the high pit suppression effect can be obtained while maintaining the high longitudinal breakdown voltage.

Then, the channel layer 26 made of a nitride semiconductor is formed on the buffer layer 25 (see FIG. 4(d)). Specifically, the channel layer 26 made of GaN can be formed to 500 to 4000 nm at a temperature of, e.g., 800° C. to 1200° C. on the buffer layer 25 by the MOVPE method.

Further, a barrier layer 27 made of a nitride semiconductor can be formed on the channel layer 26 (see FIG. 4(e)). Specifically, a barrier layer 27 made of AlGaN can be formed to 10 to 50 nm at a temperature of, e.g., 800° C. to 1200° C. on the channel layer 26 by the MOVPE method. Here, the channel layer 26 and the barrier layer 27 can form an operation layer 29.

As the acceptor element which is introduced into the buffer layer 25, it is preferable to use any one of a transition metal, carbon, and magnesium. As the acceptor element, such elements can be preferably used, and iron is particularly preferable.

As described above, the semiconductor base substance 10 can be manufactured. According to the method for manufacturing a semiconductor base substance, it is possible to manufacture the semiconductor base substance in which the high pit suppression effect can be obtained assuredly while maintaining the high longitudinal breakdown voltage.

A method for manufacturing a semiconductor device will now be described with reference to FIG. 5.

First, the semiconductor base substance 10 manufactured by using the manufacturing method described with reference to FIG. 4 is prepared (see FIG. 5(a)).

Figure 5:
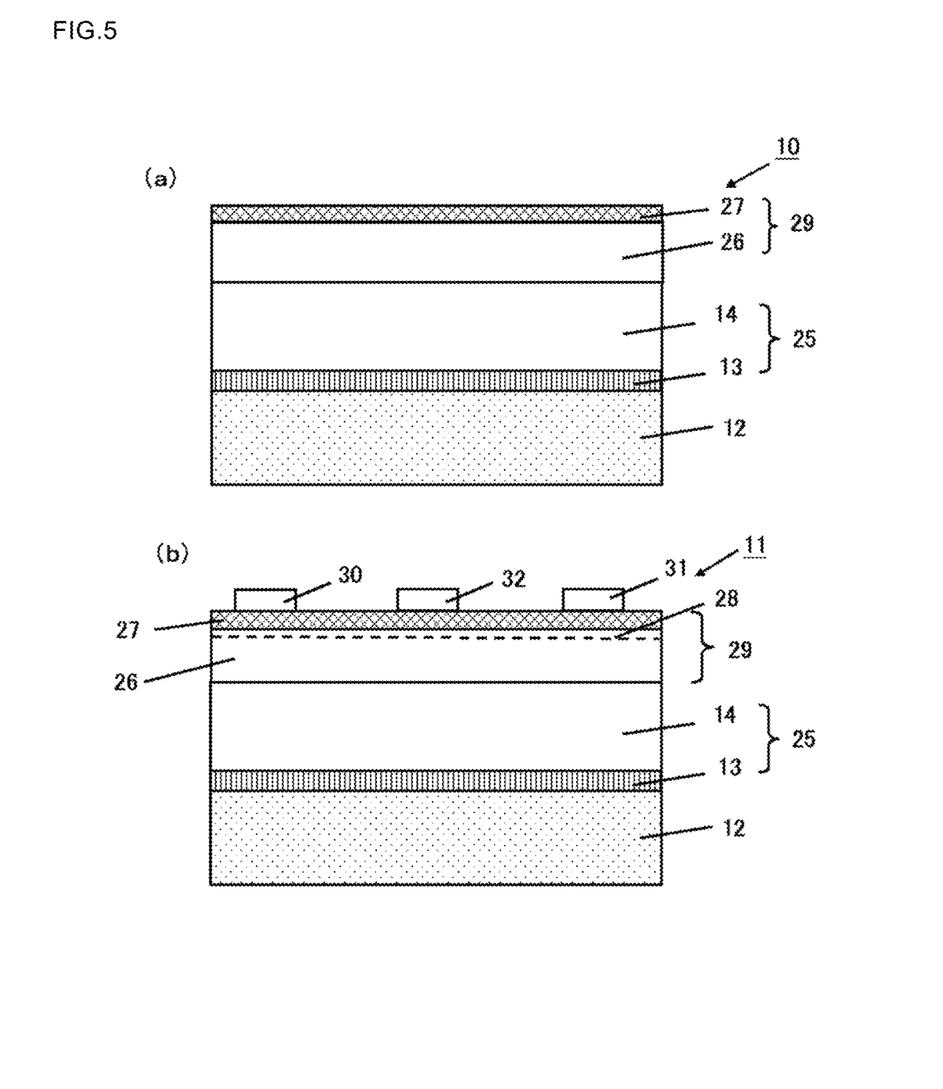
FIG. 5 are process cross-sectional views showing one embodiment of a method for manufacturing a semiconductor device.

Then, electrodes (e.g., a first electrode 30, a second electrode 31, and a control electrode 32) are formed over the channel layer 26 through the barrier layer 27 (see FIG. 5(b)). Here, each of the first electrode 30 and the second electrode 31 can be formed of, e.g., a stacked film of Ti/Al, and the control electrode 32 can be formed of, e.g., a stacked film of a lower film made of a metal oxide or a metal nitride such as SiO or SiN and an upper film made of a metal such as Ni, Au, Mo, or Pt.

A semiconductor device 11 can be manufactured as described above. According to the method for manufacturing a semiconductor device, it is possible to manufacture the high-quality semiconductor device in which generation of pits is suppressed while maintaining the high longitudinal breakdown voltage.

EXAMPLES

Although the present invention will now be more specifically described hereinafter with reference to Examples and Comparative Examples, the present invention is not restricted thereto.

Example 1

Figure 6:
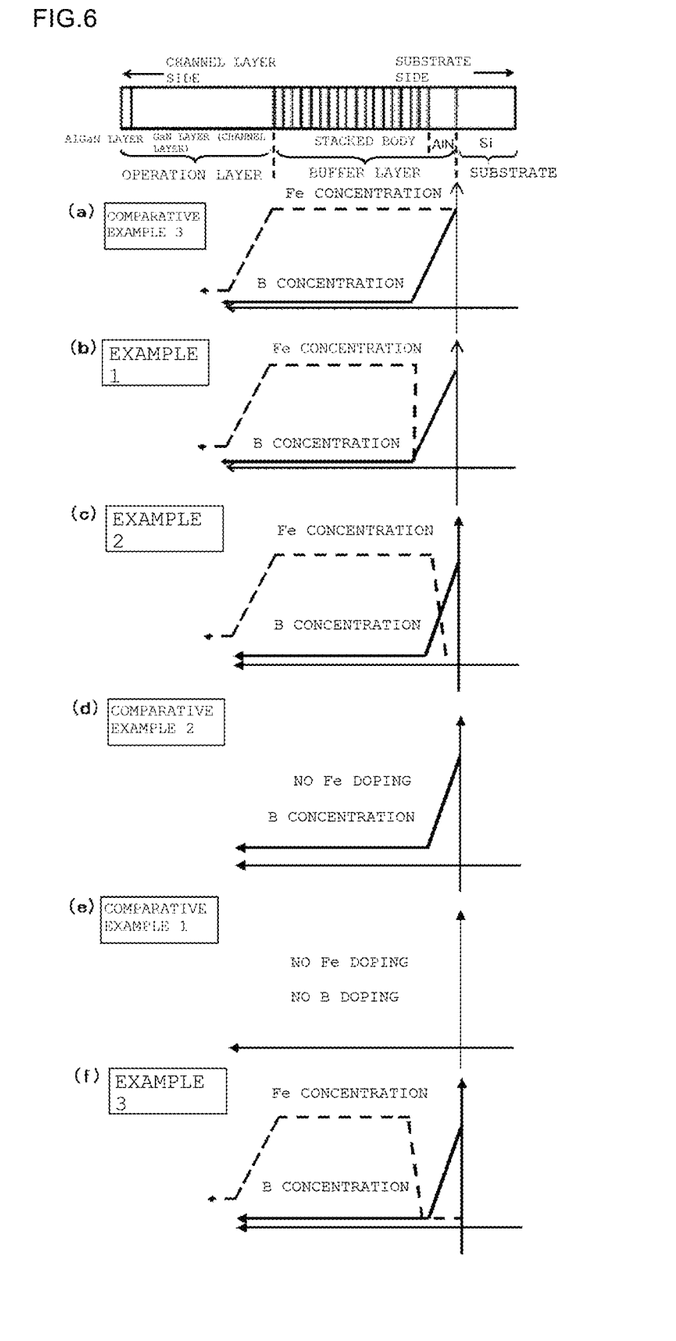
FIG. 6 are views each showing an impurity profile of a semiconductor base substance in each of Examples 1 to 3 and Comparative Example 1 to 3.

Such a semiconductor base substance 10 as shown in FIG. 1 which includes a buffer layer having an iron concentration profile and a boron concentration profile shown in FIG. 6(b) was fabricated. That is, in the buffer layer of Example 1 which includes the buffer layer having an initial layer made of AlN on a substrate 12 made of silicon and a stacked body in which GaN layers and AlN layers are alternately stacked, a decreasing region where boron concentration gradually decreases from $3\times10^{19}$ atoms/cm$^3$ toward the channel layer 26 side from the substrate 12 side and an increasing region which is provided on the decreasing region and where iron concentration increases to $5\times10^{19}$ atoms/cm$^3$ toward the channel layer 26 side from the substrate 12 side are provided on the substrate 12, and the iron concentration increases to $5\times10^{19}$ atoms/cm$^3$ at a time after the boron concentration sufficiently decreases. Here, an increase ratio of acceptor element concentration in the increasing region in the buffer layer is larger (i.e., a tilt is steep) than a decrease ratio of the acceptor element concentration in a decreasing region which is configured to be lowered in an upper portion of the channel layer above the increasing region.

Figure 7:
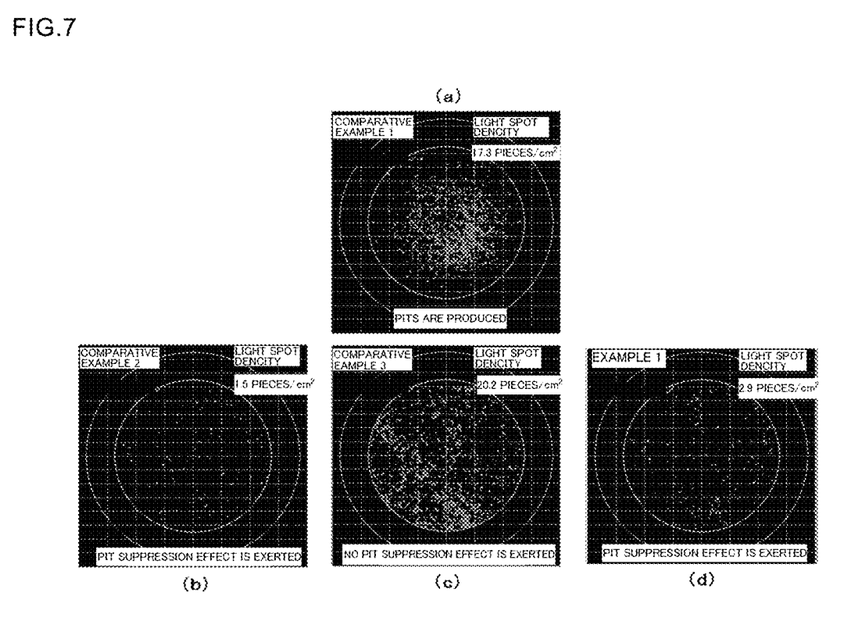
FIG. 7 are views each showing a pit density evaluation result of the semiconductor base substance based on microscopic dark field image analysis according to each of Example 1 and Comparative Examples 1 to 3.

The fabricated semiconductor base substance 10 was subjected to light spot density evaluation (i.e., pit density evaluation) based on microscopic dark field image analysis. FIG. 7(d) shows an evaluation result.

Further, a length of each crack from a substrate edge of the fabricated semiconductor base substance 10 was confirmed. Table 1 shows confirmed crack lengths.

Electrodes were formed over the channel layer 26 through a barrier layer 27 in the fabricated semiconductor base substance 10 to fabricate such a semiconductor device 11 as shown in FIG. 3.

Figure 8:
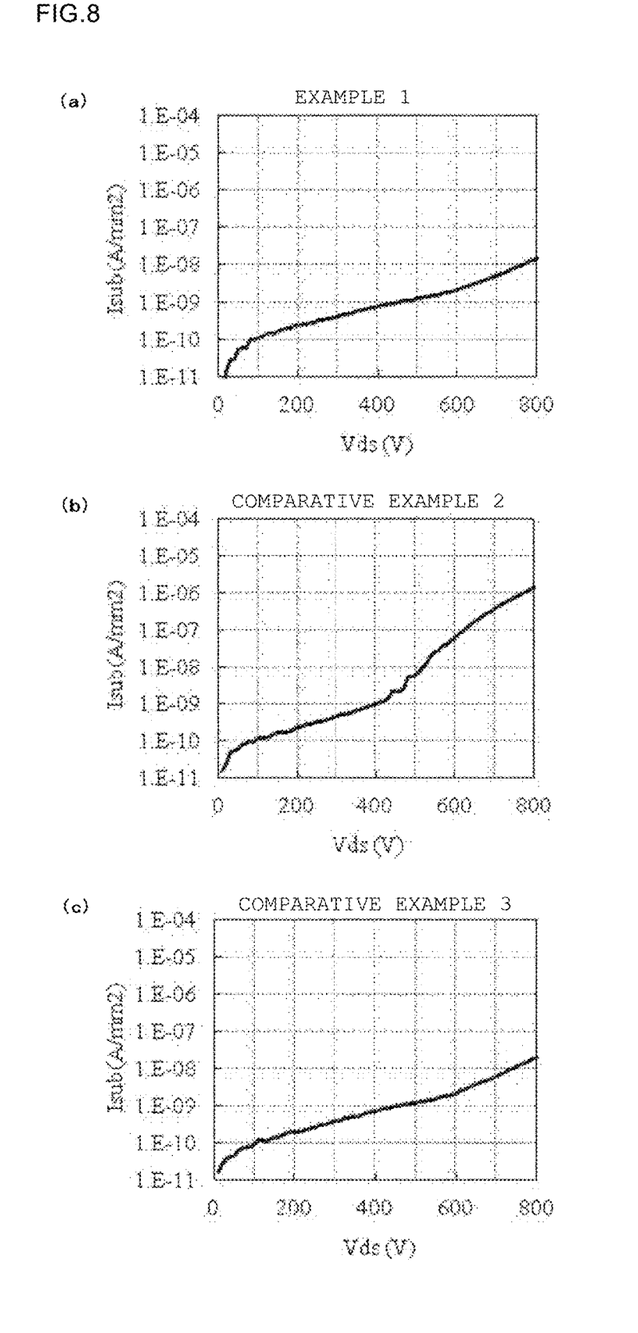
FIG. 8 are views each showing a device breakdown voltage (longitudinal breakdown voltage) measurement result of the semiconductor device according to each of Example 1 and Comparative Examples 2 and 3.
Figure 9:
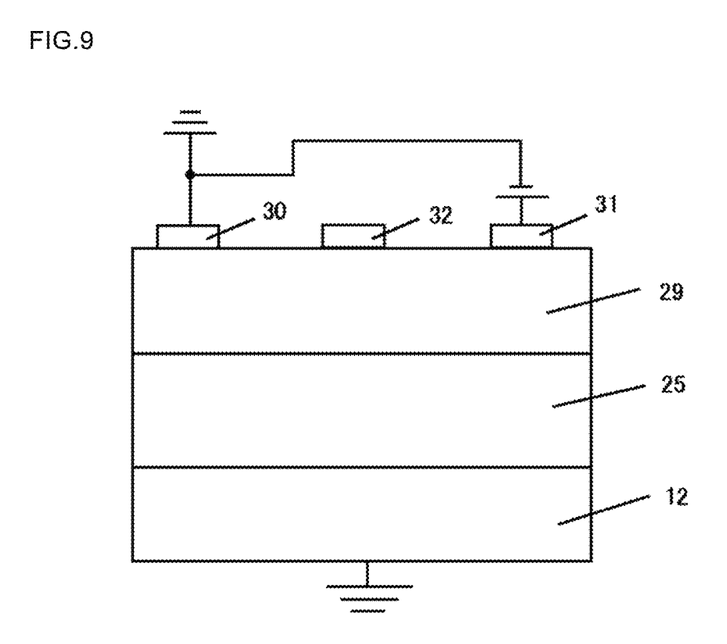
FIG. 9 is a view showing a method for measuring a device breakdown voltage (longitudinal breakdown voltage)

In the fabricated semiconductor device 11, a device breakdown voltage (a longitudinal breakdown voltage) when the semiconductor device 11 is OFF was measured by using such a measuring method as shown in FIG. 9. A measurement result is shown in FIG. 8(a).

Example 2

Such a semiconductor base substance 10 as shown in FIG. 1 which includes a buffer layer having an iron concentration profile and a boron concentration profile shown in FIG. 6(c) was fabricated. That is, in the buffer layer of Example 2 which includes the buffer layer having an initial layer made of AlN on a substrate 12 made of silicon and a stacked body in which GaN layers and AlN layers are alternately stacked, a decreasing region where boron concentration gradually decreases from $3\times10^{19}$ atoms/cm$^3$ toward the channel layer 26 side from the substrate 12 side and an increasing region which is provided on the channel layer 26 side of a boron concentration decrease start position and where iron concentration increases to $5\times10^{19}$ atoms/cm$^3$ toward the channel layer 26 side from the substrate 12 side are provided on the substrate 12, and the boron concentration decreasing region partially overlaps the iron concentration increasing region, and the boron concentration decreases while the iron concentration gradually increases. Here, an increase ratio of acceptor element concentration in the increasing region in the buffer layer is larger (i.e., a tilt is steep) than a decrease ratio in a decreasing region which is configured to lower acceptor element concentration in an upper portion of the channel layer above the increasing region.

Like Example 1, the fabricated semiconductor base substance 10 was subjected to light spot density evaluation (i.e., pit density evaluation). An evaluation result was substantially the same as that in Example 1.

Further, a length of each crack from a substrate edge of the fabricated semiconductor base substance 10 was confirmed. Table 1 shows confirmed crack lengths.

Electrodes were formed over the channel layer 26 through a barrier layer 27 in the fabricated semiconductor base substance 10 to fabricate such a semiconductor device 11 as shown in FIG. 3.

In the fabricated semiconductor device 11, like Example 1, a device breakdown voltage (a longitudinal breakdown voltage) was measured, and a measurement result was better than that of Example 1 since a total number of iron atoms in the buffer layer is larger than that in Example 1.

Example 3

Such a semiconductor base substance 10 as shown in FIG. 1 which includes a buffer layer having an iron concentration profile and a boron concentration profile shown in FIG. 6(f) was fabricated. That is, in the buffer layer of Example 3 which includes the buffer layer having an initial layer made of AlN on a substrate 12 made of silicon and a stacked body in which GaN layers and AlN layers are alternately stacked, a decreasing region where boron concentration gradually decreases from $3\times10^{19}$ atoms/cm$^3$ toward the channel layer 26 side from the substrate 12 side and an increasing region which is provided on the channel layer 26 side of a boron concentration decrease start position and where iron concentration increases to $5\times10^{19}$ atoms/cm$^3$ toward the channel layer 26 side from the substrate 12 side are provided on the substrate 12, and the boron concentration decreasing region does not overlap the the iron concentration increasing region (i.e., the iron concentration increases after the boron concentration decreases). Here, an increase ratio of acceptor element concentration in the increasing region in the buffer layer is larger (i.e., a tilt is steep) than a decrease ratio in the decreasing region which is configured to lower the acceptor element concentration in an upper portion of the channel layer above the increasing region.

Like Example 1, the fabricated semiconductor base substance 10 was subjected to light spot density evaluation (i.e., pit density evaluation). An evaluation result was better than that in Example 1.

Further, a length of each crack from a substrate edge of the fabricated semiconductor base substance 10 was confirmed. Table 1 shows confirmed crack lengths.

Electrodes were formed over the channel layer 26 through a barrier layer 27 in the fabricated semiconductor base substance 10 to fabricate such a semiconductor device 11 as shown in FIG. 3.

In the fabricated semiconductor device 11, like Example 1, a device breakdown voltage (a longitudinal breakdown voltage) was measured, and a measurement result was slightly poorer than that of Example 1 since a total number of iron atoms in the buffer layer is smaller than that in Example 1.

Comparative Example 1

A semiconductor base substance including a buffer layer having an iron concentration profile and a boron concentration profile shown in FIG. 6(e) was fabricated. That is, in the buffer layer of Comparative Example 1, iron doping and boron doping were not performed.

Like Example 1, the fabricated semiconductor base substance was subjected to light spot density evaluation (i.e., pit density evaluation). An evaluation result is shown in FIG. 7(a).

Further, a length of each crack from a substrate edge of the fabricated semiconductor base substance was confirmed. Table 1 shows confirmed crack lengths.

It is to be noted that, in the semiconductor base substance of Comparative Example 1, an enormous number of pits were produced, and hence fabrication of a semiconductor device and measurement of a device breakdown voltage (a longitudinal breakdown voltage) could not able to be performed.

Comparative Example 2

A semiconductor base substance including a buffer layer having an iron concentration profile and a boron concentration profile shown in FIG. 6(d) was fabricated. That is, in the buffer layer of Comparative Example 2, boron doping was performed like Example 1, but iron doping was not carried out.

Like Example 1, the fabricated semiconductor base substance was subjected to light spot density evaluation (i.e., pit density evaluation). An evaluation result is shown in FIG. 7(b).

Further, a length of each crack from a substrate edge of the fabricated semiconductor base substance was confirmed. Table 1 shows confirmed crack lengths.

Electrodes were formed over a channel layer through a barrier layer in the fabricated semiconductor base substance to fabricate a semiconductor device.

In the fabricated semiconductor device, like Example 1, a device breakdown voltage (a longitudinal breakdown voltage) was measured. A measurement result is shown in FIG. 8(b).

Comparative Example 3

A semiconductor base substance including a buffer layer having an iron concentration profile and a boron concentration profile shown in FIG. 6(a) was fabricated. That is, in the buffer layer of Comparative Example 3, boron doping was performed like Example 1, but iron doping was carried out to the entire buffer layer (i.e., it was carried out from an initial layer of the buffer layer).

Like Example 1, the fabricated semiconductor base substance was subjected to light spot density evaluation (i.e., pit density evaluation). An evaluation result is shown in FIG. 7(c).

Further, a length of each crack from a substrate edge of the fabricated semiconductor base substance was confirmed. Table 1 shows confirmed crack lengths.

Electrodes were formed over a channel layer through a barrier layer in the fabricated semiconductor base substance to fabricate a semiconductor device.

In a region where no pit was observed in the fabricated semiconductor device, like Example 1, a device breakdown voltage (a longitudinal breakdown voltage) was measured. A measurement result is shown in FIG. 8(c).

TABLE 1

|  | Crack length from substrate edge |
|---|---|
| Example 1 | 9 to 10 mm |
| Example 2 | 9 to 10 mm |
| Example 3 | 9 to 10 mm |
| Comparative Example 1 | 9 to 10 mm |
| Comparative Example 2 | 9 to 10 mm |
| Comparative Example 3 | 11 to 13 mm |

As can be understood from FIG. 7, when the iron doping is performed from the initial layer of the buffer layer like Comparative Example 3, the pit suppression effect provided by the boron doping is lowered (i.e., in terms of pit density, the effect is lost). It is presumed that the effect is lowered due to an influence of iron which enters a site having the pit suppression effect rather than boron. Furthermore, in Example 1 where the iron doping was performed from the stacked body, there is no influence of the iron doping, and the pit suppression effect which is equivalent to that in Comparative Example 2 where no iron doping was performed was provided. It is to be noted that, in Example 2 in which the boron concentration decreases while the iron concentration increases on the substrate side of the buffer layer, likewise, the pit suppression effect which is equivalent to that in Example 1 was obtained. Moreover, in Example 3 in which the iron concentration increase after the boron concentration decreases on the substrate side of the buffer layer, the pit suppression effect which is better than that in Example 1 was provided.

Additionally, as can be understood from Table 1, the cracks extend longer in Comparative Example 3 where the iron doping is performed from the AlN initial layer (i.e., the iron doping is performed in all layers of the buffer layer) and, on the other hand, in Example 1 where the iron doping was performed from the stacked body having the reduced boron concentration without carrying out the iron doping in the AlN initial layer doped with boron, crack lengths were equivalent to those in Comparative Example 2 where the iron doping was not performed. It can be considered that this result was obtained since the iron doping was not performed regarding the layer doped with boron. It is to be noted that, in Example 2 where the boron concentration decreases while the iron concentration increases on the substrate side of the buffer layer, the crack lengths were equivalent to those in Example 1. Further, in Example 3 where the iron concentration increases after the boron concentration decreases on the substrate side of the buffer layer, the crack lengths were likewise equivalent to those in Example 1.

Figure 10:
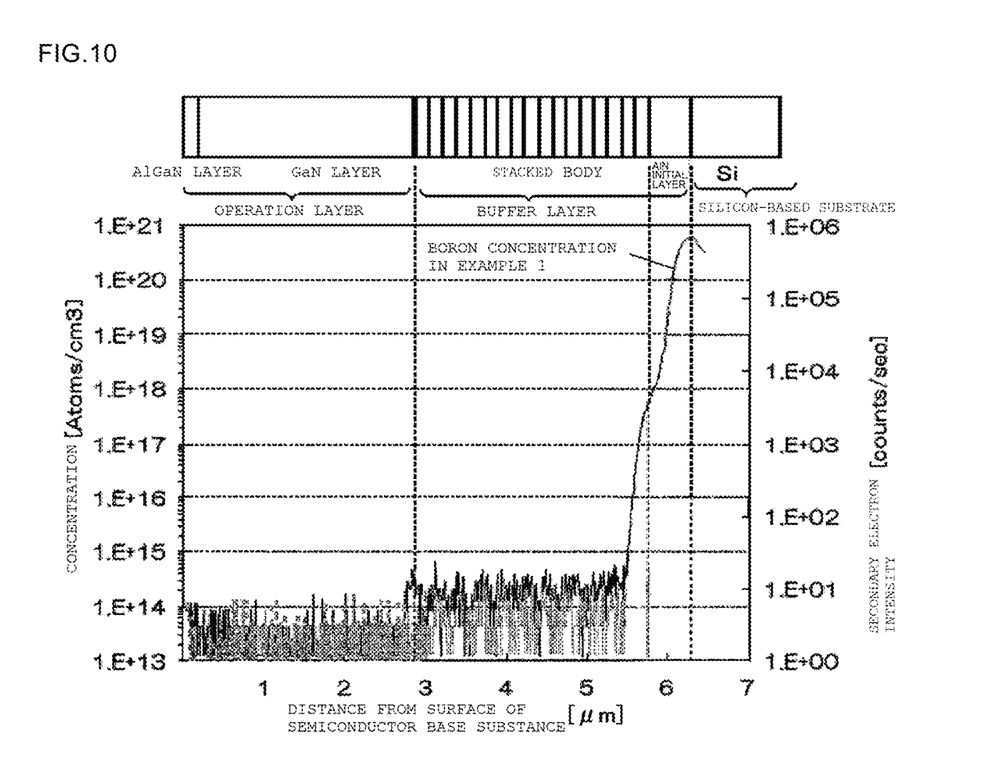
FIG. 10 is a view showing a boron concentration profile of the semiconductor base substance according to Example 1.

Furthermore, as can be understood from FIG. 8, in Comparative Example 3 where the iron doping is performed from the initial layer of the buffer layer, the breakdown voltage in the longitudinal direction was improved by performing the iron doping as compared with Comparative Example 2 where no iron doping was carried out. However, in Comparative Example 3, the bit suppression effect is reduced as described above (see FIG. 7(c)). Furthermore, in Example 1 where the iron doping was performed from the stacked body, an effect of the iron doping (i.e., an improvement in longitudinal breakdown voltage) was obtained as compared with Comparative Example 2. In Example 1, the longitudinal breakdown voltage equivalent to that in Comparative Example 3 was obtained since each layer doped with boron in the stacked body of the buffer layer (i.e., each layer which is not doped with iron) is as thin as approximately 200 nm as shown in FIG. 10. It is to be noted that, in Example 2 where the boron concentration decreases while the iron concentration increases on the substrate side of the buffer layer, likewise, the longitudinal breakdown voltage better than that in Example 1 was obtained. Moreover, in Example 3 where the iron concentration increases after the boron concentration decreases on the substrate side of the buffer layer, the longitudinal breakdown voltage which is slightly poorer than that in Example 1 but better than that in Comparative Example 2 was provided.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

Figure 11:
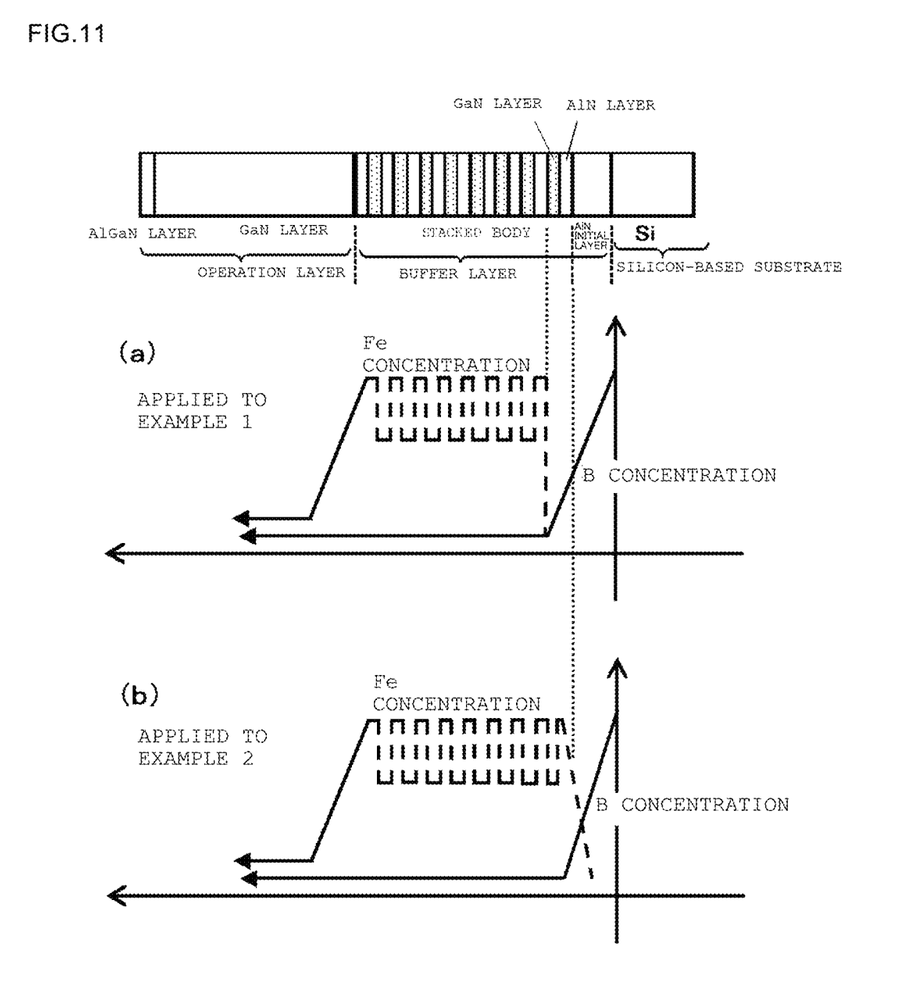
FIG. 11 are views each showing an impurity profile of the semiconductor base substance when iron concentration differs depending on AlN layers and GaN layers in a stacked body of a buffer layer.

For example, in the semiconductor base substance 10' in FIG. 2, only the first layers 15 (e.g., the AlN layers) of the stacked body 14 may contain the acceptor element, and the second layers 16 (e.g., the GaN layers) may not contain the acceptor element or may contain the reduced acceptor element. In this case, as shown in FIG. 11(a), an impurity profile in Example 1 has iron concentration increased at positions of the AlN layers in the stacked body and has the iron concentration reduced at positions of the GaN layers in the stacked body. Furthermore, as shown in FIG. 11(b), an impurity profile in Example 2 has iron concentration increased at positions of the initial layer and the AlN layers in the stacked body and has the iron concentration reduced at positions of the GaN layers in the stacked body. Even in such a case as described above, the same effect can be provided.

Moreover, the expression "upper" also includes a case where a different layer is interposed.

The invention claimed is:
1. A semiconductor base substance comprising:
   a substrate;
   a buffer layer which is made of a nitride semiconductor and provided on the substrate; and
   a channel layer which is made of a nitride semiconductor and provided on the buffer layer;

wherein the buffer layer comprises:
- a first region which is provided on the substrate side and has boron concentration higher than acceptor element concentration,
- a second region which is provided on the first region, and has boron concentration lower than that in the first region and acceptor element concentration higher than that in the first region,
- a decreasing region where the boron concentration decreases from the substrate side toward the channel layer side, and
- an increasing region where an acceptor element increases from the substrate side toward the channel layer side on the channel layer side of a boron concentration decrease start position of the decreasing region, wherein the decreasing region partially overlaps the increasing region.

2. The semiconductor base substance according to claim 1,
wherein the buffer layer comprises an initial layer made of AlN on the substrate side, and
the initial layer does not contain the acceptor element.

3. The semiconductor base substance according to claim 2,
wherein the acceptor element is any one of a transition metal, carbon, and magnesium.

4. The semiconductor base substance according to claim 1,
wherein the buffer layer comprises an initial layer made of AlN on the substrate side, and
the acceptor element concentration of the initial layer is lower than the boron concentration of the initial layer.

5. The semiconductor base substance according to claim 4,
wherein the acceptor element is any one of a transition metal, carbon, and magnesium.

6. The semiconductor base substance according to claim 1,
wherein the acceptor element is any one of a transition metal, carbon, and magnesium.

7. A semiconductor device comprising:
a semiconductor base substance according to claim 1; and
electrodes provided over the channel layer.

8. The semiconductor base substance according to claim 1, wherein
the boron concentration in the first region is $1\times10^{17}$ to $1\times10^{21}$ atoms/cm$^{-3}$,
the acceptor element concentration in the first region is $1\times10^{15}$ to $5\times10^{17}$ atoms/cm$^{-3}$,
the boron concentration in the second region is $1\times10^{13}$ to $1\times10^{15}$ atoms/cm$^{-3}$, and
the acceptor element concentration in the second region is $5\times10^{17}$ to $1\times10^{20}$ atoms/cm$^{-3}$.

* * * * *